United States Patent
Schmitt

(10) Patent No.: US 8,039,784 B2
(45) Date of Patent: Oct. 18, 2011

(54) READOUT CHIP WITH BINARY COUNTER FOR FAST SINGLE PHOTON COUNTING

(75) Inventor: Bernd Schmitt, Zurich (CH)

(73) Assignee: Paul Scherrer Institut, Villigen PSI (CH)

( * ) Notice: Subject to any disclaimer, the term of this patent is extended or adjusted under 35 U.S.C. 154(b) by 541 days.

(21) Appl. No.: 12/085,337

(22) PCT Filed: Nov. 20, 2006

(86) PCT No.: PCT/EP2006/011098
§ 371 (c)(1),
(2), (4) Date: May 20, 2008

(87) PCT Pub. No.: WO2007/057213
PCT Pub. Date: May 24, 2007

(65) Prior Publication Data
US 2009/0285352 A1   Nov. 19, 2009

(30) Foreign Application Priority Data
Nov. 21, 2005 (EP) .................... 05025326

(51) Int. Cl.
*H01L 31/00* (2006.01)
(52) U.S. Cl. .......... 250/214.1; 250/214 R; 250/370.08; 250/370.09; 377/53

(58) Field of Classification Search ............... 250/208.1, 250/208.2, 214.1, 214 R, 559.47, 214 DC, 250/370.08, 370.29; 377/53, 54
See application file for complete search history.

(56) References Cited

U.S. PATENT DOCUMENTS

| | | | |
|---|---|---|---|
| 4,477,918 A | 10/1984 | Nossen et al. | |
| 5,665,959 A | 9/1997 | Fossum et al. | |
| 6,028,630 A * | 2/2000 | Fukui et al. | 348/312 |
| 6,442,183 B1 * | 8/2002 | Ema | 372/38.02 |

FOREIGN PATENT DOCUMENTS

| | | |
|---|---|---|
| EP | 0 505 324 A1 | 9/1992 |
| JP | 59122180 A | 7/1984 |
| JP | 06165040 A | 6/1994 |
| WO | WO 2004/064168 A1 | 7/2004 |

* cited by examiner

*Primary Examiner* — Francis M Legasse, Jr.
(74) *Attorney, Agent, or Firm* — Lawrence A. Greenberg; Werner H. Stemer; Ralph E. Locher

(57) ABSTRACT

A readout chip for single photon counting has a plurality of N individually working channels each assigned to a respective detector diode. Each channel has a counter designed as a binary counter having a length of M bits and a number of programmable bits. Further, the readout chip has a serial shift register or parallel data input register for entering values for the counter and the programmable bits, and a number of data output shift registers each having a number of K data outputs. Means are provided for selectively multiplexing each of the K data outputs onto a selectable bit of the data output shift register.

6 Claims, 1 Drawing Sheet

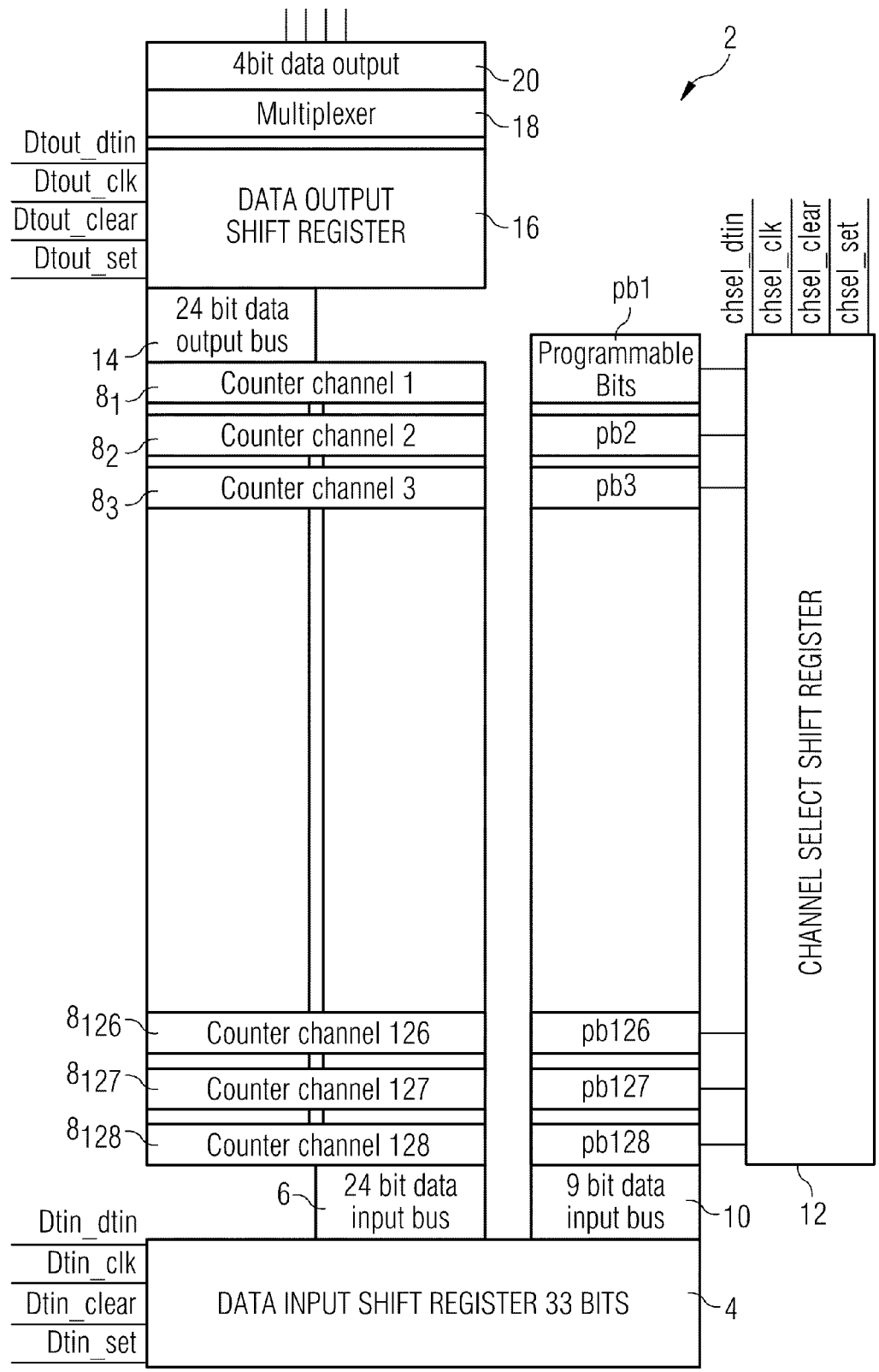

READOUT CHIP WITH BINARY COUNTER FOR FAST SINGLE PHOTON COUNTING

CROSS-REFERENCE TO RELATED APPLICATIONS

The present application is a national stage application of International Application No. PCT/EP2006/011098, filed on Nov. 20, 2006, which claims priority to European Patent Application No. 05025326.9, filed on Nov. 21, 2005, which are incorporated herein by reference.

BACKGROUND OF THE INVENTION

The present invention relates to a readout chip for single photon counting.

X-ray diffraction patterns are useful in the analysis of both organic and inorganic crystallographic structures. Especially organic materials, such as protein crystals, impose stringent requirements on x-ray detectors, particularly where the x-ray source is high flux synchrotron radiation that enables and requires, due to the radiation damage, an experiment to be done rapidly. Furthermore, an important and developing field is time-resolved diffraction experiments using synchrotron radiation, such as crystallography and/or powder diffraction analysis. Monitoring a time-dependent reaction in a sample, i.e. a crystal or a powder, can elucidate the time-dependent crystal/molecular changes that occur in a chemical reaction. High time resolution is often critical in such monitoring.

A fast single photon-counting imaging device for the above-mentioned purposes has been disclosed in the international patent application WO 2004/064168. This reference teaches in detail a photon-counting imaging device for single x-ray counting which comprises:
 a) a layer of photosensitive material;
 b) a source of bias potential;
 c) a source of threshold voltage supply;
 d) an N×M array of photodetector diodes arranged in said layer of photosensitive material; each of said photodetector diodes having a bias potential interface and a diode output interface, said bias potential interface of each photodetector diode being connected to said bias potential;
 e) an N×M array of high gain, low noise readout unit cells, one readout unit cell for each photodetector diode;
 f) each readout unit cell comprising an input interface connected to said diode output interface, a high-gain voltage amplifying means comprising a comparator unit, a digital counter unit, comprising a digital counter, and a digital counter output interface connected in series, each digital counter unit counting an output signal of the comparator unit; said digital counter output signal is proportional to the number of absorped incident photons in the respective photodetector diode,
 g) a multiplexing means comprising a row select and a column select allowing to access each of the readout cell units, i.e. to read out the digital data as actually stored in the digital counter to the digital counter output interface;
 h) each digital counter output interface connected to an output bus;
 i) said output bus being connected to a data processing means controlling the multiplexing means.

According to these measures, a photon counting imaging device is created having an architecture of the readout circuitry that allows to be tolerant with respect to a local defect of a detector diode and/or readout unit cell and that allows to control and redesign the program and/or the status of each detector diode and/or readout unit cell in order to achieve a fast photon counting imaging device.

However, even for this fast photon counting imaging device it is desirable to increase the speed of the data readout. So far, the counter in the reference cited above has been designed as a pseudo-random counter, such as an 18 bit shift register with an XOR feedback. The data from this counter is serially transmitted on one digital output pin during readout. For an 18 bit shift register a readout time of at least 1+18+1 cycles is required.

SUMMARY OF THE INVENTION

Therefore, it is the aim of the present invention to improve the properties and the speed of readout electronic significantly without losing accuracy of the counting.

This aim is achieved according to the present invention by a readout chip for single photon counting which comprises:
 a) a plurality of N individually working channels each assigned to a respective detector diode; each channel comprising a counter being designed as a binary counter having a length of M bits and a number of programmable bits;
 b) a serial shift register or parallel data input register for entering values for the counter and the programmable bits; the binary counter enables a variable length readout since for a low number of counts not all bits have to be read out (in contrast to e.g. a pseudo random counter realized as a shift register with an X-or feedback) and
 c) a number of data output shift register; each having a number of K data outputs, whereby means are provided for selectively multiplexing each of the K data outputs onto a selectable bit of the data output shift register.

These features allow a much faster readout of the counter since the counter can be readout in parallel groups of K bits. Further, for each counter in each channel only a variable length of selectable bits can be readout by multiplexing the K data outputs to the bits of interest which increases the readout speed tremendeously, i.e. considering in crystallographic investigations some rare regions with higher counting rates and the gross part of regions with comparably low counting rates due to the regular lattice structure of the probe.

In order to further speed up the operation, the data input shift register, the data output shift register as well as the channel select shift register and the counters comprise a CLEAR and a SET CONTROL signal which allows to clear and set the registers within one cycle per signal. To simplify the generation of control signals and to reduce their number the control signals are multiplexed to the data input-, data output- and channel select shift registers as well as the counter. However the signals needed for the redout are also available non multiplexed in order not to compromise the readout speed.

In order to be able to interfere with the analogue part of the readout electronic, the programmable bits can be used for a DAC, i.e. for fine-tuning of a comparator threshold, enabling/disabling of a calibration pulse, for enabling/disabling the analogue output of a channel and for enabling the output of the channels comparator.

In a preferred embodiment of the present invention, the data input shift register and the data output shift register may have at least the length of the counter. Preferably, the data input shift register has additionally a number of bits for the programmable bits which are used as explained above. Of course, the length of the counter may be an odd or an even multiple of the number K of the data outputs. According to the value of the multiple a respective number of integer cycles is used to read out the complete data output shift register. For example, assuming a 24 bit binary counter and a 4 bit parallel data output, six cycles for reading the 24 bit string counting value plus three cycles for selecting, controlling and resetting the data output shift register are required to readout the counter value of one channel. In case only four bits are necessary to be read out, like the four minor important bits 0 through 3, only 4 cycles are required in total. These features allow to cut down the readout time by more than 50% for those "channels of minor interest" (lower counting rates).

Further advantageous features of the preferred embodiments of the present invention can be learned from the other depending claims.

BRIEF DESCRIPTION OF THE SEVERAL VIEWS OF THE DRAWINGS

Examples of the present invention are described in detail with reference to the drawing, which depicts a schematic view on the architecture of a readout chip for use in a photon-counting imaging device.

DETAILED DESCRIPTION OF THE INVENTION

In the present example, a readout chip 2 comprises a data input shift register 4 having a length of 33 bits. 24 bits of the data input shift register 4 is associated with a 24 bit data input bus 6 which connects to selectable counters $8_1$ to $8_{128}$. The remaining nine bits of the data input shift register 4 are associated via a 9-bit data input bus 10 with the programmable bits pb1 to pb128 of each of the 128 channels. For selecting the channel, a channel select shift register 12 is provided. The programmable bits pb1 to pb128 are used for example for enabling/disabling the respective channel, for forwarding the analogue signal (which reflects the number and energy of the incident photons on each diode) to the analogue output of the chip (i.e. for calibration and debugging purposes), other bits are used for programming the DAC (6 bits), for fine-tuning of the comparator threshold, for enabling/disabling of a calibration pulse etc.

The counter $8_1$ to $8_{128}$ are selectively connectable via a 24-bit data output bus 14 to a data output shift register 16. By a multiplexer 18 the 24 bits of the data output shift register can be selectively assigned to a 4-bit data output 20 which allows in the present example to readout in parallel four selectable bits of the data output shift register 16. The multiplexer, in the present example, is controlled by bits of the data input shift register. Considering exemplarily the diffraction pattern of a probe having a regular crystalline lattice, most of the channels will have comparably small counting rates where a readout of 4 or 8 bits appear to be sufficient for these channels; only those channels having positions corresponding to the lattice structure of the probe will receive significantly higher counting rates which will lead to the readout of all 24 bits of the counter of the respective channels. In order to further speed up the operation, all the registers 4, 12, $8_{1-128}$ and 16 comprise a leg for a CLEAR and a SET CONTROL signal. These control signals are further multiplexed which means that the number of control signals is reduced while further simplifying the operation. This can be done for example by mode multiplexing of the respective control signals.

The example shown in the drawing comprises a basic layout of the readout chip 2 which also allows various modifications. One preferred modification can be the multiplication of the architecture with respect to the data output shift register 16 for which several data output shift register could be provided. This feature enables a readout of several channels simultaneously, for example a second data output shift register enables the set-up to readout 2×64 channels instead of 1×128 channels. The channels could also be organized as a 2 dimensional matrix (e.g. for 2-dimensional detectors).

Another preferred modification may propose a data output 20 having more than 4 bits up to the maximal length of the counter $8_1$ to $8_{128}$ which would allow to readout the counter much faster and in parallel mode in case of the same length for both the counter and the data output within only one cycle (plus control signal cycles).

The counter of a distinct channel can be set to an arbitrary value. The values for the programmable bits and the counter value can be entered into the readout chip 2 by the serial data input shift register 4 which could be also be a parallel data input register for the complete length of the counters. The input shift register also serves to program the multiplexer for the data output.

The invention claimed is:

1. A readout chip for single photon counting, comprising:
   a plurality of N individually working channels each assigned to a respective detector diode, each channel including a counter being designed as a binary counter having a length of M bits and a number of programmable bits;
   a serial shift register or parallel data input register for entering values for the counter and the programmable bits; and
   a number of data output shift registers, each data output shift register of the number of data output shift registers having a length of the M bits and a number of K data outputs, whereby means are provided for selectively multiplexing each of the K data outputs onto a selectable bit of the data output shift register.

2. The readout chip according to claim 1, wherein the data input shift register and the data output shift register, as well as a channel select shift register and counter, include a CLEAR and a SET CONTROL signal leg.

3. The readout chip according to claim 1, wherein control signals are multiplexed and the ones needed for the readout are also available non multiplexed.

4. The readout chip according to claim 1, wherein the programmable bits are used for a DAC, to fine-tune a comparator threshold, enabling/disabling of a calibration pulse, for enabling/disabling an analogue output of a channel and for enabling an output of a channel comparator.

5. The readout chip according to claim 1, wherein the data input shift register and the data output shift register have at least the length of the counter.

6. The readout chip according to claim 1, wherein the length of the counter is an odd or an even multiple of the number K of the data outputs.

* * * * *